United States Patent
Sung

(10) Patent No.: US 11,789,084 B2
(45) Date of Patent: Oct. 17, 2023

(54) WIRELESS BATTERY CONTROL SYSTEM, METHOD AND BATTERY PACK FOR ASSIGNING ID TO A PLURALITY OF SLAVE MANAGEMENT MODULES

(71) Applicant: LG CHEM, LTD., Seoul (KR)

(72) Inventor: Chang-Hyun Sung, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 602 days.

(21) Appl. No.: 16/629,444

(22) PCT Filed: Feb. 18, 2019

(86) PCT No.: PCT/KR2019/001928
§ 371 (c)(1),
(2) Date: Jan. 8, 2020

(87) PCT Pub. No.: WO2019/164203
PCT Pub. Date: Aug. 29, 2019

(65) Prior Publication Data
US 2020/0200828 A1 Jun. 25, 2020

(30) Foreign Application Priority Data

Feb. 22, 2018 (KR) .................. 10-2018-0021224
Feb. 13, 2019 (KR) .................. 10-2019-0016885

(51) Int. Cl.
*B60L 53/12* (2019.01)
*B60L 58/21* (2019.01)
(Continued)

(52) U.S. Cl.
CPC ............ *G01R 31/382* (2019.01); *B60L 53/12* (2019.02); *B60L 58/21* (2019.02); *H04B 17/318* (2015.01); *H04W 84/20* (2013.01)

(58) Field of Classification Search
CPC ..... G01R 31/382; H04B 17/318; B60L 53/12; B60L 58/21; H04W 84/20
See application file for complete search history.

(56) References Cited

U.S. PATENT DOCUMENTS

2011/0175574 A1   7/2011  Sim et al.
2011/0273023 A1* 11/2011  Nishida ............... H01M 10/486
                                                              307/77
(Continued)

FOREIGN PATENT DOCUMENTS

JP       4378888 B2 * 12/2009  ............... H04B 7/24
JP       4796119 B2    10/2011
(Continued)

OTHER PUBLICATIONS

Abe K, JP-4378888-B2 Machine Translation, Dec. 2009 (Year: 2009).*
(Continued)

*Primary Examiner* — Drew A Dunn
*Assistant Examiner* — Pamela J Jeppson
(74) *Attorney, Agent, or Firm* — Morgan, Lewis & Bockius LLP

(57) ABSTRACT

Provided is a wireless battery control system, a method and a battery pack. The system includes a master, and a plurality of slaves sequentially positioned at different distances from the master. The master wirelessly transmit a preparation signal when entering an ID assignment mode. Each slave wirelessly transmits Received Signal Strength Indicator (RSSI) of the preparation signal to the master when wirelessly receiving the preparation signal from the master or other slave during operation in a standby mode. The master wirelessly transmits an ID associated with the operation count to a slave having wirelessly transmitted a maximum (Continued)

RSSI among the RSSIs of the preparation signal, and increases the operation count by 1.

20 Claims, 7 Drawing Sheets

(51) Int. Cl.
    *G01R 31/382* (2019.01)
    *H04B 17/318* (2015.01)
    *H04W 84/20* (2009.01)

(56) References Cited

U.S. PATENT DOCUMENTS

| | | |
|---|---|---|
| 2013/0271072 A1 | 10/2013 | Lee et al. |
| 2014/0035365 A1 | 2/2014 | Yoo |
| 2014/0365792 A1 | 12/2014 | Yun |
| 2015/0242665 A1* | 8/2015 | Antonescu .......... G06K 7/10356 340/8.1 |
| 2015/0244191 A1* | 8/2015 | Matsumura .......... H02J 7/0013 320/116 |
| 2016/0325626 A1 | 11/2016 | Honda et al. |
| 2020/0266905 A1* | 8/2020 | Wang .................... H04L 43/10 |

FOREIGN PATENT DOCUMENTS

| | | | |
|---|---|---|---|
| JP | 2012-222913 A | 11/2012 | |
| JP | 2014-103785 A | 6/2014 | |
| JP | 5677171 B2 | 2/2015 | |
| JP | 2016-21720 A | 2/2016 | |
| JP | 5902149 B2 | 4/2016 | |
| KR | 20050101412 A * | 10/2005 | ............. B42F 7/12 |
| KR | 10-2011-0013747 A | 2/2011 | |
| KR | 10-1070388 B1 | 10/2011 | |
| KR | 10-2014-0143076 A | 12/2014 | |
| KR | 10-1631064 B1 | 6/2016 | |
| KR | 10-2016-0139231 A | 12/2016 | |
| KR | 10-2017-0098451 A | 8/2017 | |
| WO | 2015/121979 A1 | 8/2015 | |

OTHER PUBLICATIONS

Lee J, KR20050101412A Machine Translation, Oct. 2005 (Year: 2005).*

David Kohanbash, "Antenna Separation: How Close Can You Go?", May 16, 2016 (Year: 2016).*

International Search Report issued in corresponding International Patent Application No. PCT/KR2019/001928, dated Jun. 5, 2019.

* cited by examiner

WIRELESS BATTERY CONTROL SYSTEM, METHOD AND BATTERY PACK FOR ASSIGNING ID TO A PLURALITY OF SLAVE MANAGEMENT MODULES

TECHNICAL FIELD

The present disclosure relates to a wireless battery control system, a method and a battery pack, and more particularly, to a wireless battery control system, a method and a battery pack for sequentially assigning IDs associated with the location of each slave management module to a plurality of slave management modules.

The present application claims priority to Korean Patent Application No. 10-2018-0021224 filed in the Republic of Korea on Feb. 22, 2018 and Korean Patent Application No. 10-2019-0016885 filed in the Republic of Korea on Feb. 13, 2019, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

A battery pack for devices requiring large capacity and high voltage such as electric vehicles generally includes a plurality of battery modules connected in series and a plurality of management modules. Each management module is also referred to as a battery management system (BMS), and monitors and controls the battery module that each management module manages. To efficiently manage the state of each battery module included in the battery pack, a battery control system having a multi slave structure is disclosed. The battery control system having a multi slave structure includes a plurality of slave management modules installed to monitor the state of each battery module and a master management module to integratedly control the plurality of slave management modules. For the master management module to collect state information of each battery module from each slave management module and transmit a control command for each battery module to each slave management module, each slave management module should be assigned with an ID indicating the order in which the battery module that each slave management module manages is located among the plurality of battery modules.

Patent Literature 1 discloses wherein a master sequentially assigns IDs to a plurality of slaves. However, the ID assignment method according to Patent Literature 1 is performed on the premise of wired connection between the master and each slave, so there is a risk of wire disconnection and a great spatial limitation.

(Patent Literature 1) Korean Patent Publication No. 10-2011-0013747 (published Feb. 10, 2011)

DISCLOSURE

Technical Problem

The present disclosure is designed to solve the above-described problem, and therefore the present disclosure is directed to providing a wireless battery control system, a method and a battery pack for wirelessly assigning IDs according to the physical location at which a plurality of slave management modules is each positioned.

These and other objects and advantages of the present disclosure may be understood by the following description and will be apparent from the embodiments of the present disclosure. Further, it will be readily understood that the objects and advantages of the present disclosure may be realized by the means set forth in the appended claims and combinations thereof.

Technical Solution

A wireless battery control system for a battery pack including a plurality of battery modules according to an aspect of the present disclosure is provided for a battery pack including first to $N^{th}$ battery modules. N is a natural number of 2 or greater. The wireless battery control system includes a master management module, and first to $N^{th}$ slave management modules configured to monitor a state of each of the first to $N^{th}$ battery modules. The first to $N^{th}$ slave management modules are sequentially positioned so that distances from the master management module are different from each other. When the master management module enters an ID assignment mode, the master management module is configured to initialize an operation count, and configured to wirelessly transmit a preparation signal. When each slave management module wirelessly receives the preparation signal from the master management module or other slave management module during operation in a standby mode, each slave management module is configured to wirelessly transmit Received Signal Strength Indicator (RSSI) of the preparation signal to the master management module. The master management module is configured to wirelessly transmit an ID associated with the operation count to one of the first to $N^{th}$ slave management modules having wirelessly transmitted a maximum RSSI among the RSSIs of the preparation signal. Each slave management module is configured to wirelessly transmit the preparation signal and configured to terminate the standby mode, in response to receiving an ID wirelessly transmitted thereto from the master management module. The master management module is configured to increase the operation count by 1 each time the master management module wirelessly transmits an ID to each slave management module.

Each slave management module may include a first slave antenna, and a second slave antenna. The first slave antenna may be positioned closer to the master management module than the second slave antenna.

Each slave management module may be configured to wirelessly receive the preparation signal through the first slave antenna. Each slave management module may be configured to wirelessly receive the ID through the first slave antenna. Each slave management module may be configured to wirelessly transmit the RSSI of the preparation signal through the first slave antenna. Each slave management module may be configured to wirelessly transmit the preparation signal through the second slave antenna.

The first slave antenna of one of two slave management modules positioned adjacent to each other and the second slave antenna of the other slave management module may be positioned within a predetermined distance.

The first slave antenna of one of the first to $N^{th}$ slave management modules positioned closest to the master management module may be positioned within a predetermined distance from a master antenna of the master management module.

The master management module may be configured to determine whether the operation count is equal to a target value, when the maximum RSSI is equal to or less than a threshold RSSI. The master management module may be configured to terminate the ID assignment mode, when the operation count is equal to the target value.

The master management module may be configured to determine whether the operation count is equal to a target value, when the maximum RSSI is equal to or less than a threshold RSSI. The master management module may be configured to wirelessly transmit a reset signal, when the operation count is unequal to the target value. Each slave management module may be configured to invalidate the ID already assigned to itself, in response to the reset signal.

Each slave management module may be configured to wirelessly transmit a response signal in response to receiving the ID wirelessly transmitted to each slave management module from the master management module. Each slave management module may be configured to wirelessly transmit a RSSI of a response signal wirelessly transmitted by other slave management module to the master management module. The master management module may be configured to wirelessly receive the RSSIs of the response signal from each of the first to k-$1^{th}$ slave management modules, when the response signal is wirelessly transmitted by a slave management module assigned with the ID in the $k^{th}$ order among the first to $N^{th}$ slave management modules. k is a natural number of 2 or greater and N or less. The master management module may be configured to increase the operation count by 1, when a largest one of the RSSIs of the response signals wirelessly received from each of the first to k-$1^{th}$ slave management modules is equal to the RSSI of the response signal wirelessly received from the k-$1^{th}$ slave management module.

The master management module may be configured to wirelessly transmit a reset signal when the largest one of the RSSIs of the response signal received from each of the first to k-$1^{th}$ slave management modules is unequal to the RSSI of the response signal received from the k-$1^{th}$ slave management module. Each slave management module may be configured to invalidate the ID already assigned thereto, in response to the reset signal.

A battery pack according to another aspect of the present disclosure includes the wireless battery control system.

A method according to another aspect of the present disclosure is for assigning IDs to first to $N^{th}$ slave management modules sequentially positioned so that distances from a master management module are different from each other. N is a natural number of 2 or greater. The method includes initializing, by the master management module, an operation count, and wirelessly transmitting a preparation signal, when the master management module enters an ID assignment mode, wirelessly receiving, by the master management module, RSSI of the preparation signal from each slave management module that is in a standby mode, wirelessly transmitting, by the master management module, an ID associated with the operation count to one of the first to $N^{th}$ slave management modules having wirelessly transmitted a maximum RSSI among the RSSIs of the preparation signal, when the maximum RSSI is larger than a threshold RSSI, and increasing, by the master management module, the operation count by 1 each time the master management module wirelessly transmits an ID to each slave management module.

The method may further include determining, by the master management module, whether the operation count is equal to a target value, when the maximum RSSI is equal to or less than the threshold RSSI. The ID assignment mode may end, when the operation count is equal to the target value.

The method may further include determining, by the master management module, whether the operation count is equal to a target value, when the maximum RSSI is equal to or less than the threshold RSSI, and wirelessly transmitting, by the master management module, a reset signal, when the operation count is unequal to the target value. Each slave management module may be configured to invalidate the ID assigned to itself, in response to the reset signal.

The method may further include wirelessly receiving, by the master management module, RSSIs of a response signal from each of the first to k-$1^{th}$ slave management modules, when the response signal is wirelessly transmitted by a slave management module assigned with the ID in the $k^{th}$ order among the first to $N^{th}$ slave management modules, and increasing, by the master management module, the operation count by 1, when a largest one of the RSSIs of the response signal wirelessly received from each of the first to k-$1^{th}$ slave management modules is equal to the RSSI of the response signal wirelessly received from the k-$1^{th}$ slave management module. k is a natural number of 2 or greater and N or less. Each slave management module may be configured to wirelessly transmit a response signal, in response to receiving the ID wirelessly transmitted to itself from the master management module. Each slave management module may be configured to wirelessly transmit a RSSI of a response signal wirelessly transmitted by other slave management module to the master management module.

The method may further include wirelessly transmitting, by the master management module, a reset signal when the largest one of the RSSIs of the response signal wirelessly received from each of the first to k-$1^{th}$ slave management modules is unequal to the RSSI of the response signal wirelessly received from the k-$1^{th}$ slave management module. Each slave management module may be configured to invalidate the ID already assigned to itself, in response to the reset signal.

Advantageous Effects

According to at least one of the embodiments of the present disclosure, IDs may be wirelessly assigned to the plurality of slave management modules sequentially positioned at different distances from the master management module. Accordingly, compared to the conventional ID assignment method requiring wired connection between the master management module and each slave management module, there is no disconnection risk of a cable, and spatial utilization may be enhanced.

Additionally, according to at least one of the embodiments of the present disclosure, it is possible to suppress the signal interference in the process of wirelessly assigning IDs by selectively using two antennas provided in each slave management module so that the distances from the master are different from each other.

Further, according to at least one of the embodiments of the present disclosure, it is possible to verify whether IDs are assigned in the physical order of the plurality of slave management modules each time an ID is assigned to each slave.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

MODE FOR DISCLOSURE

Figure 1:
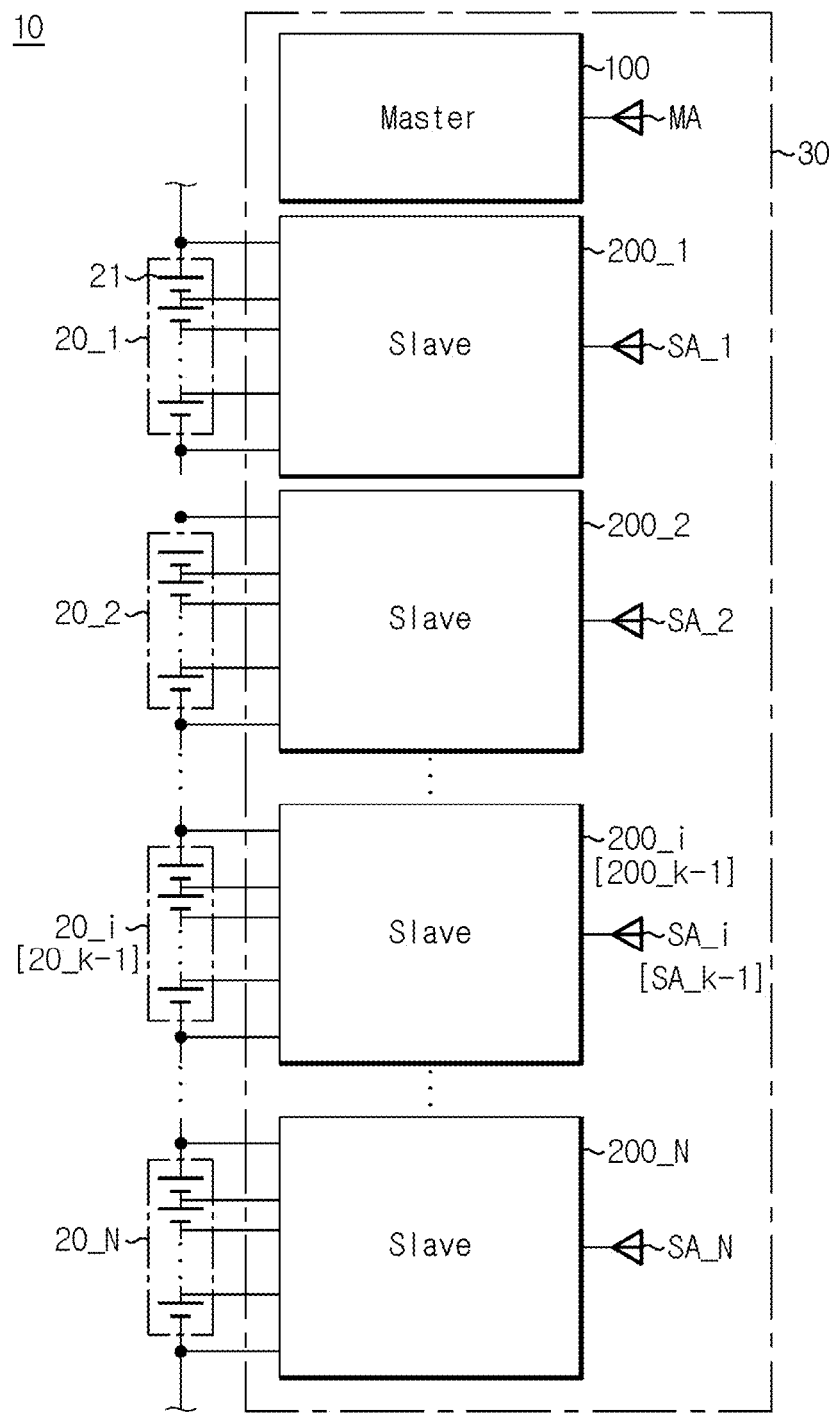
FIG. 1 is an exemplary diagram showing a configuration of a battery pack including a wireless battery control system according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 2:
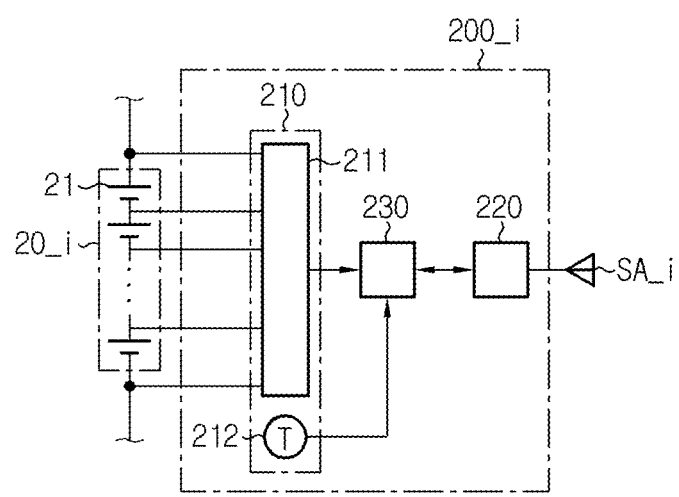
FIG. 2 is an exemplary diagram showing a configuration of a slave management module of FIG. 1.

FIG. 1 is an exemplary diagram showing a configuration of a battery pack 10 including a wireless battery control system 30 according to an embodiment of the present disclosure, and FIG. 2 is an exemplary diagram showing a configuration of a slave management module of FIG. 1.

Referring to FIG. 1, the battery pack 10 includes a plurality of battery modules 20_1~20_N (N is a natural number that is equal to or greater than 2) and a wireless battery control system 30. The battery pack 10 may be mounted in an electric vehicle, and may supply power required to drive an electric motor of the electric vehicle.

The plurality of battery modules 20_1~20_N is connected in series, or in series and in parallel. Each battery module 20 includes at least one battery cell 21.

The wireless battery control system 30 includes a master management module 100 and a plurality of slave management modules 200_1~200_N. Hereinafter, for convenience of description, the master management module 100 is referred to as 'master', and the slave management module 200 is referred to as 'slave'.

The master 100 is configured to integratedly control the battery pack 10. The master 100 is operably coupled to the plurality of slave management modules 200_1~200_N. The master 100 may communicate with an external main controller (for example, an electronic control unit (ECU) of an electric vehicle) via a wired network such as Controller Area Network (CAN).

The master 100 includes a master antenna MA, and may wirelessly communicate with each of the plurality of slaves 200_1~200_N through the master antenna MA.

The plurality of slaves 200_1~200_N is electrically connected to the plurality of battery modules 20_1~20_N one to one. When i=1~(N−1), the slave 200_i is connected to the battery module 20_i, and is configured to monitor the state of the battery module 20_i and each battery cell 21 included in the battery module 20_i. Additionally, the slave 200_i wirelessly transmits data indicating the monitored state of the battery module 20_i to the master 100. The master 100 may be configured to diagnose whether each battery module 20 and each slave 200 are normal or abnormal based on data wirelessly collected from the plurality of slaves 200_1~200_N.

The plurality of slaves 200_1~200_N is sequentially positioned so that distances from the master 100 are different from each other. That is, referring to FIG. 1, the slave 200_i is positioned closer to the master 100 than the slave 200_i+1 positioned adjacent to the slave 200_i. It can be said that the slave 200_i is positioned at the upstream side of the slave 200_i+1, and the slave 200_i+1 is positioned at the downstream side of the slave 200_i.

Referring to FIG. 2, the slave 200_i includes a sensing unit 210, a wireless communication circuit 220, one slave antenna SA_i and a control unit 230.

The sensing unit 210 includes a voltage measurement circuit 211 and a temperature sensor 212. The sensing unit 210 may further include a current sensor. The voltage measurement circuit 211 includes at least one voltage sensor. The voltage measurement circuit 211 measures the module voltage of the battery module 20. The voltage measurement circuit 211 may measure the cell voltage of each battery cell 21 included in the battery module 20. The voltage measurement circuit 211 transmits a voltage signal indicating the measured module voltage and the cell voltage to the control unit 230. The temperature sensor 212 is positioned within a predetermined distance from the battery module 20, and transmits a temperature signal indicating the temperature of the battery module 20 to the control unit 230. The current sensor is installed on the charge/discharge current pathway of the battery pack 10, and measures the current flowing during charging/discharging of the battery pack 10 and transmits a current signal indicating the measured current to the control unit 230.

The wireless communication circuit 220 is connected to the slave antenna SA_i. The wireless communication circuit 220 may be implemented by hardware using a RF System on Chip (SoC). The wireless communication circuit 220 may wirelessly transmit data to the master 100 or other slave 200, or wirelessly receive data from the master 100 or other slave 200 through the slave antenna SA_i. Referring to FIG. 1, the slave antenna SA_i of the slave 200_i is positioned closer to the master antenna MA of the master 100 than the slave antenna SA_i+1 of the slave 200_i+1. It can be said that the slave antenna SA_i of the slave 200_i is positioned at the upstream side of the slave antenna SA_i+1 of the slave 200_i+1, and the slave antenna SA_i+1 of the slave 200_i+1 is positioned at the downstream side of the slave antenna SA_i of the slave 200_i. As a result, when the master 100 wirelessly transmits a preparation signal, the Received Signal Strength Indicators (RSSIs) of the preparation signal detected by the plurality of slaves 200_1~200_N operating in a standby mode are different from one another.

The control unit 230 may be operably coupled to the sensing unit 210 and the wireless communication circuit 220, and may individually control the operation of each of the sensing unit 210 unit and the wireless communication circuit 220. The control unit 230 may be implemented by hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. A memory device may be embedded in the control unit 230, and the memory device may include, for example, RAM, ROM, register, hard disk, an optical recording medium or a magnetic recording medium. The memory device may store, update and/or erase programs including various types of control logics that are executed by the control unit 230, and/or data created when the control logics are executed.

The wireless communication circuit 220 is configured to selectively perform at least one of preset functions in response to a signal from the master 100 or other slave 200 wirelessly received through the slave antenna SA_i.

When the preparation signal is received through the slave antenna SA_i, the wireless communication circuit 220 may measure the RSSI of the received preparation signal. The wireless communication circuit 220 may wirelessly transmit the measured RSSI to the master 100 through the slave antenna SA_i. In the specification, wireless transmission of the RSSI may refer to wireless transmission of a signal indicating the RSSI. When an ID is received through the slave antenna SA_i, the wireless communication circuit 220 may store the received ID in the control unit 230, and wirelessly transmit a response signal to the master 100. The response signal is for a signal for reporting to the master 100 that the ID has been properly received wirelessly.

Each of the plurality of slaves 200_1~200_N may operate in the standby mode until its ID is assigned by the master 100, and terminate the standby mode in response to wireless receiving the ID for itself from the master 100. Each of the plurality of slaves 200_1~200_N is configured to measure the RSSI of the preparation signal wirelessly received from the master 100 or other slave 200 during operation in the standby mode, and wirelessly transmit the measured RSSI of the preparation signal to the master 100. On the contrary, each of the plurality of slaves 200_1~200_N may be configured not to measure the RSSI of the preparation signal wirelessly received from the master 100 or other slave 200 when it is not operating in the standby mode, i.e., it is already assigned with its ID from the master 100.

The slave 200_i may combine data to be transmitted to the master 100 and data indicating its unique information (for example, address, serial number), and wirelessly transmit the combined data to the master 100 through the slave antenna SA_i during operating in the standby mode because an ID for the slave 200_i is not assigned from the master 100. When the master 100 extracts the unique information from the signal wirelessly transmitted by the slave 200_i, the master 100 may identify the slave 200_i even before the ID for the slave 200_i is assigned to the slave 200_i.

The term "operation count" as used herein may refer to a value that is updated by the master 100 each time a predetermined condition is satisfied so that different IDs are sequentially assigned to the plurality of slaves 200_1~200_N.

A process whereby IDs are sequentially assigned to the plurality of slaves 200_1~200_N by the master 100 within the wireless battery control system 30 shown in FIG. 1 will be described below.

As an ID assignment mode starts, the master 100 initializes the operation count, and wirelessly transmits the preparation signal through the master antenna MA. The preparation signal wirelessly transmitted from the master antenna MA may be received by at least one of the plurality of slaves 200_1~200_N through the slave antenna SA_1~SA_N.

Each of the plurality of slaves 200_1~200_N operating in the standby mode measures the RSSI of the preparation signal from the master 100, and wirelessly transmits the measured RSSI to the master 100. Then, the master 100 determines a maximum RSSI among the RSSIs from each of the plurality of slaves 200_1~200_N. Because the slave 200_1 is closest to the master 100, if a failure did not occur in the slave 200_1, the RSSI wirelessly transmitted by the slave 200_1 will be determined as the maximum RSSI. The master 100 assigns an ID associated with the current operation count to the slave 200_1 having wirelessly transmitted the maximum RSSI, and wirelessly transmits the assigned ID to the slave 200_1. The slave 200_1 stores the ID from the master 100 in its memory device, then wirelessly transmits a response signal to the master 100, and terminates the standby mode. The response signal indicates that the ID for the slave 200_1 is assigned to the slave 200_1 normally. The master 100 increases the operation count by 1, in response to receiving the response signal from the slave 200_1.

After the slave 200_1 wirelessly transmits the response signal to the master 100 through the slave antenna SA_1, the slave 200_1 wirelessly transmits the preparation signal through the slave antenna SA_1 in place of the master 100.

Then, each of the slaves 200_2~200_N operating in the standby mode measures a RSSI of the preparation signal from the slave 200_1, and wirelessly transmits the measured RSSI to the master 100. Then, the master 100 determines a maximum RSSI among the RSSIs from each of the slaves 200_2~200_N. Because the slave 200_2 is closest to the slave 200_1, if a failure did not occur in the slave 200_2, the RSSI wirelessly transmitted by the slave 200_2 will be determined as the maximum RSSI. The master 100 assigns an ID associated with the current operation count to the slave 200_2 having wirelessly transmitted the maximum RSSI, and wirelessly transmits the assigned ID to the slave 200_2. The slave 200_2 stores the ID from the master 100 in its memory device, wirelessly transmits a response signal to the master 100, and terminates the standby mode. The response signal transmitted by the slave 200_2 indicates that the ID for the slave 200_2 is assigned to the slave 200_2 normally. The master 100 increases the operation count by 1, in response to receiving the response signal from the slave 200_2.

In this way, different IDs are sequentially assigned to the remaining slaves 200_3~200_N by the master 100. The slave 200_N assigned with an ID for the last time wirelessly transmits the preparation signal through the slave antenna SA_N. However, at the time point when the slave 200_N wirelessly transmitted the preparation signal, all the slaves 200_1~200_N terminated the standby mode. Accordingly, the master 100 cannot receive a RSSI larger than a threshold RSSI.

When the master 100 fails to receive the RSSI larger than the threshold RSSI, the master 100 checks whether the operation count is equal to a target value. The target value may be a predetermined natural number, and for example, may be equal to N. As described above, because the operation count increases by 1 each time ID assignment is completed once, when IDs are normally assigned to all the slaves 200_1~200_N, the operation count will be equal to the target value. When the operation count is equal to the target value, the master 100 may end the ID assignment mode.

On the contrary, when the RSSI larger than the threshold RSSI was not received, but the operation count is not equal to the target value, instead of terminating the ID assignment mode, the master 100 may wirelessly transmit a reset signal to all the slaves 200_1~200_N, and re-start the ID assignment mode. Each slave 200 already assigned with the ID may invalidate the ID stored in the memory device therein, and re-enter the standby mode, in response to the reset signal from the master 100.

Figure 3:
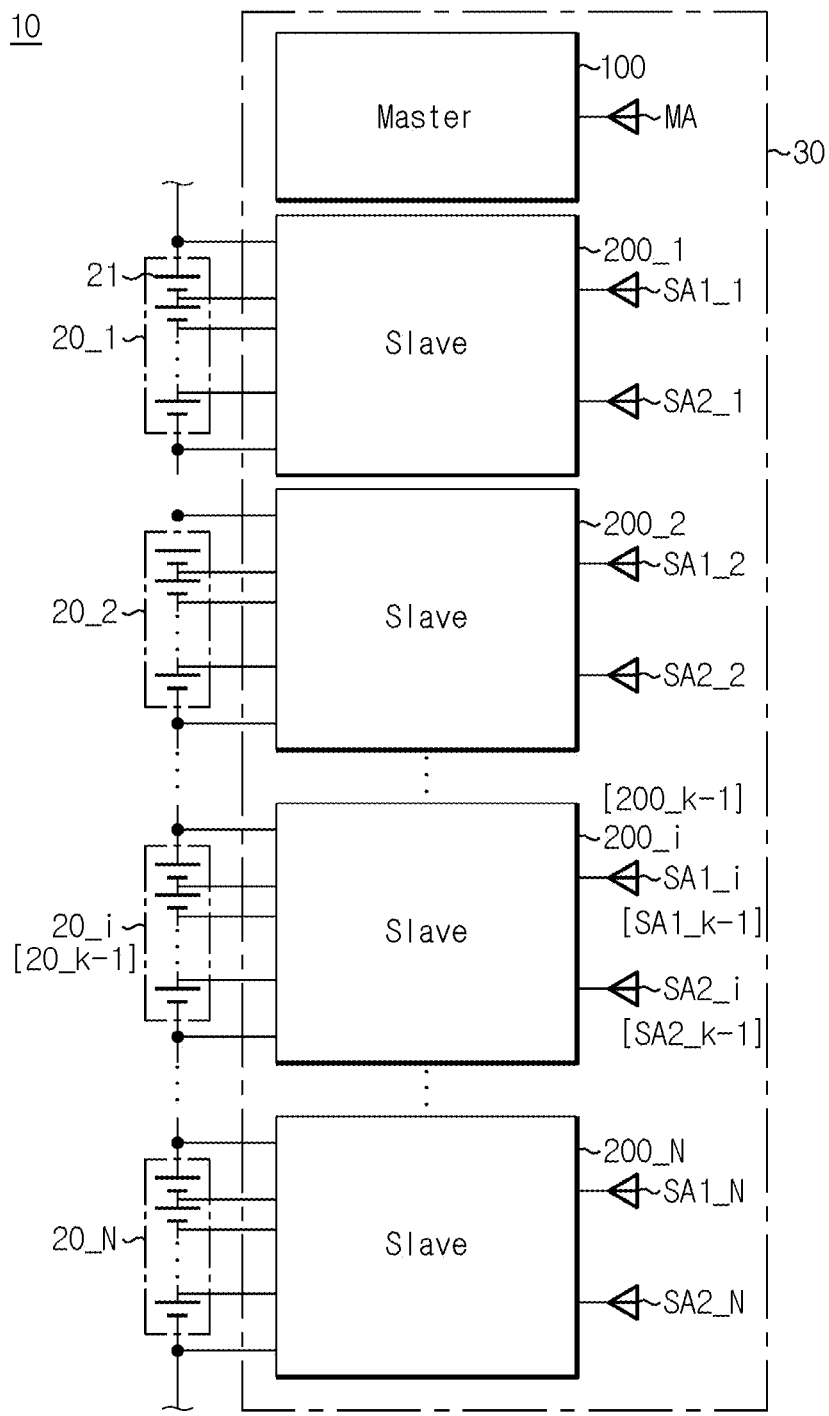
FIG. 3 is an exemplary diagram showing a configuration of a battery pack including a wireless battery control system according to another embodiment of the present disclosure.
Figure 4:
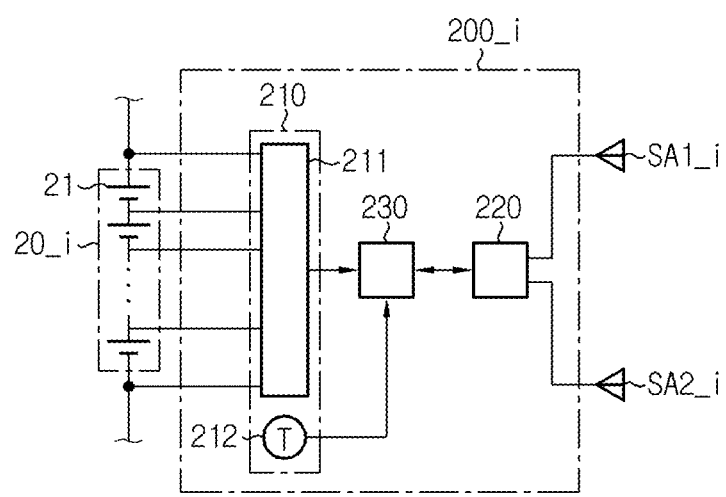
FIG. 4 is an exemplary diagram showing a configuration of a slave management module of FIG. 3.

FIG. 3 is an exemplary diagram showing a configuration of the battery pack 10 including the wireless battery control system 30 according to another embodiment of the present disclosure, and FIG. 4 is an exemplary diagram showing a configuration of the slave management module of FIG. 3.

Referring to FIGS. 3 and 4, dissimilar to FIGS. 1 and 2, when i=1~(N−1), the slave 200_i includes two slave antennas SA1_i, SA2_i, and this is a main difference, and with regard to the same components, redundant descriptions are omitted herein.

The slave 200_i includes a sensing unit 210, a wireless communication circuit 220, a first slave antenna SA1_i, a second slave antenna SA2_i and a control unit 230. The wireless communication circuit 220 is connected to the first slave antenna SA1_i and the second slave antenna SA2_i. The wireless communication circuit 220 may wirelessly transmit data to the master 100 or other slave 200, or wirelessly receive data from the master 100 or other slave 200 by selectively using at least one of the first slave antenna SA1_i and the second slave antenna SA2_i.

Referring to FIG. 3, the first slave antenna SA1_i of the slave 200_i is positioned closer to the master 100 than the first slave antenna SA1_i+1 of the slave 200_i+1. Additionally, the second slave antenna SA2_i of the slave 200_i is positioned closer to the master 100 than the second slave antenna SA2_i+1 of the slave 200_i+1. It can be said that the first slave antenna SA1_i and the second slave antenna SA2_i of the slave 200_i is positioned at the upstream side of the first slave antenna SA1_i+1 and the second slave antenna SA2_i+1 of the slave 200_i+1, and the first slave antenna SA1_i+1 and the second slave antenna SA2_i+1 of the slave 200_i+1 is positioned at the downstream side of the first slave antenna SA1_i and the second slave antenna SA2_i of the slave 200_i.

Additionally, the first slave antenna SA1_i of the slave 200_i is positioned closer to the master 100 than the second slave antenna SA2_i. It can be said that the first slave antenna SA1_i of the slave 200_i is positioned at the upstream side of the second slave antenna SA2_i, and the second slave antenna SA2_i is positioned at the downstream side of the first slave antenna SA1_i. As a result, the RSSIs of the preparation signal wirelessly received by at least two of the plurality of slaves 200_1~200_N may be different from each other.

Among two slaves (for example, 200_i and 200_i+1) positioned adjacent to each other, the second slave antenna SA2_i of the slave 200_i positioned at the upstream side and the first slave antenna SA1_i+1 of the slave 200_i+1 positioned at the downstream side are positioned facing each other within a predetermined distance (for example, 5 cm). Additionally, the first slave antenna SA1_1 of the slave 200-1 positioned closest to the master 100 and the master antenna MA of the master 100 may be positioned facing each other within a predetermined distance.

The slave 200_i may selectively activate any one of the first slave antenna SA1_i and the second slave antenna SA2_i according to a signal that will be wirelessly transmitted or was wirelessly received. When any one of the first slave antenna SA1_i and the second slave antenna SA2_i is activated, the other may be inactivated.

The slave 200_i may wirelessly receive the preparation signal through the first slave antenna SA1_i. For example, the preparation signal wirelessly received through the first slave antenna SA1_i of the slave 200_i may be a preparation signal wirelessly transmitted by one of the slaves 200_1~200_i−1 positioned at the upstream side of the slave 200_i or the master 100.

The slave 200_i may measure the RSSI of the preparation signal wirelessly received, and wirelessly transmit the measured RSSI to the master 100 through the first slave antenna SA1_i.

The slave 200_i may wirelessly receive an ID from the master 100 through the first slave antenna SA1_i. The slave 200_i may store the wirelessly received ID, and wirelessly transmit a response signal to the master 100 through the first slave antenna SA1_i. The response signal is a signal for reporting to the master 100 that the ID for the slave 200_i is wirelessly received normally. Additionally, when the slave 200_i receives the ID from the master 100, the slave 200_i may terminate the standby mode simultaneously with storing the received ID, or separately.

After the slave 200_i wirelessly transmits the response signal to the master 100 through the first slave antenna SA1_i, the slave 200_i wirelessly transmits the preparation signal through the second slave antenna SA2_i in place of the master 100. In an example, the preparation signal wirelessly transmitted through the second slave antenna SA2_i of the slave 200_i may be wirelessly transmitted to the slaves 200_i+1~200_N positioned at the downstream side of the slave 200_i.

Hereinafter, an exemplary process of sequentially assigning IDs to the plurality of slaves 200_1~200_N included in the wireless battery control system 30 shown in FIG. 3 will be described.

As the ID assignment mode starts, the master 100 initializes the operation count (for example, the operation count=1), and wirelessly transmits the preparation signal through the master antenna MA. The preparation signal wirelessly transmitted by the master antenna MA is received through the first slave antenna SA1 of at least one of the plurality of slaves 200_1~200_N.

When i=1~(N-1), the slave 200_i measures the RSSI of the preparation signal from the master 100 during operation in the standby mode, and wirelessly transmits the measured RSSI to the master 100 through the first slave antenna SA1_i.

Then, the master 100 determines a maximum RSSI among the RSSIs from each of the plurality of slaves 200_1~200_N. Because the slave 200_1 is closest to the master 100, if a failure did not occur in the slave 200_1, the RSSI wirelessly transmitted by the slave 200_1 will be determined as the maximum RSSI. The master 100 assigns an ID associated with the current operation count to the slave 200_1 having wirelessly transmitted the maximum RSSI, and wirelessly transmits the assigned ID to the slave 200_1. The slave 200_1 wirelessly receives the ID from the master 100 through the first slave antenna SA1_1, stores the received ID in the memory device therein, wirelessly transmits a response signal to the master 100 through the first slave antenna SA1_1, and terminates the standby mode. The response signal indicates that the ID for the slave 200_1 is assigned to the slave 200_1 normally. The master 100 increases the operation count by 1, in response to receipt of the response signal from the slave 200_1.

After the slave 200_1 wirelessly transmits the response signal to the master 100 through the first slave antenna SA1_1, the slave 200_1 wirelessly transmits the preparation signal through the second slave antenna SA2_1. Each of the slaves 200_2~200_N operating in the standby mode measures the RSSI of the preparation signal from the slave 200_1, and wirelessly transmits the measured RSSI to the master 100 through the first slave antenna SA1. Then, the master 100 determines a maximum RSSI among the RSSIs from each of the slaves 200_2~200_N. Because the slave 200_2 is closest to the slave 200_1, if a failure did not occur in the slave 200_2, the RSSI wirelessly transmitted by the slave 200_2 will be determined as the maximum RSSI. The master 100 assigns an ID associated with the current operation count to the slave 200_2 having wirelessly transmitted the maximum RSSI, and wirelessly transmits the assigned ID to the slave 200_2. The slave 200_2 receives the ID from the master 100 through the first slave antenna SA1_2, stores the received ID in the memory device therein, wirelessly transmits a response signal to the master 100 through the first slave antenna SA1_2, and terminates the standby mode. The response signal transmitted by the slave 200_2 indicates that the ID for the slave 200_2 is assigned to the slave 200_2 normally. The master 100 increases the operation count by 1, in response to receiving the response signal from the slave 200_2.

In this way, different IDs are sequentially assigned the remaining slaves 200_3~200_N by the master 100. The slave 200_N assigned with an ID for the last time wirelessly transmits the preparation signal through the second slave antenna SA2_N.

The method of FIGS. 5 and 6 as described below may start when the master 100 enters the ID assignment mode. The master 100 may enter the ID assignment mode, in response to a command from an external device (for example, an ECU of an electric vehicle). Hereinafter, assume that the plurality of slaves 200_1~200_N is all in the standby mode at the time point when the master 100 entered the ID assignment mode.

Figure 5:
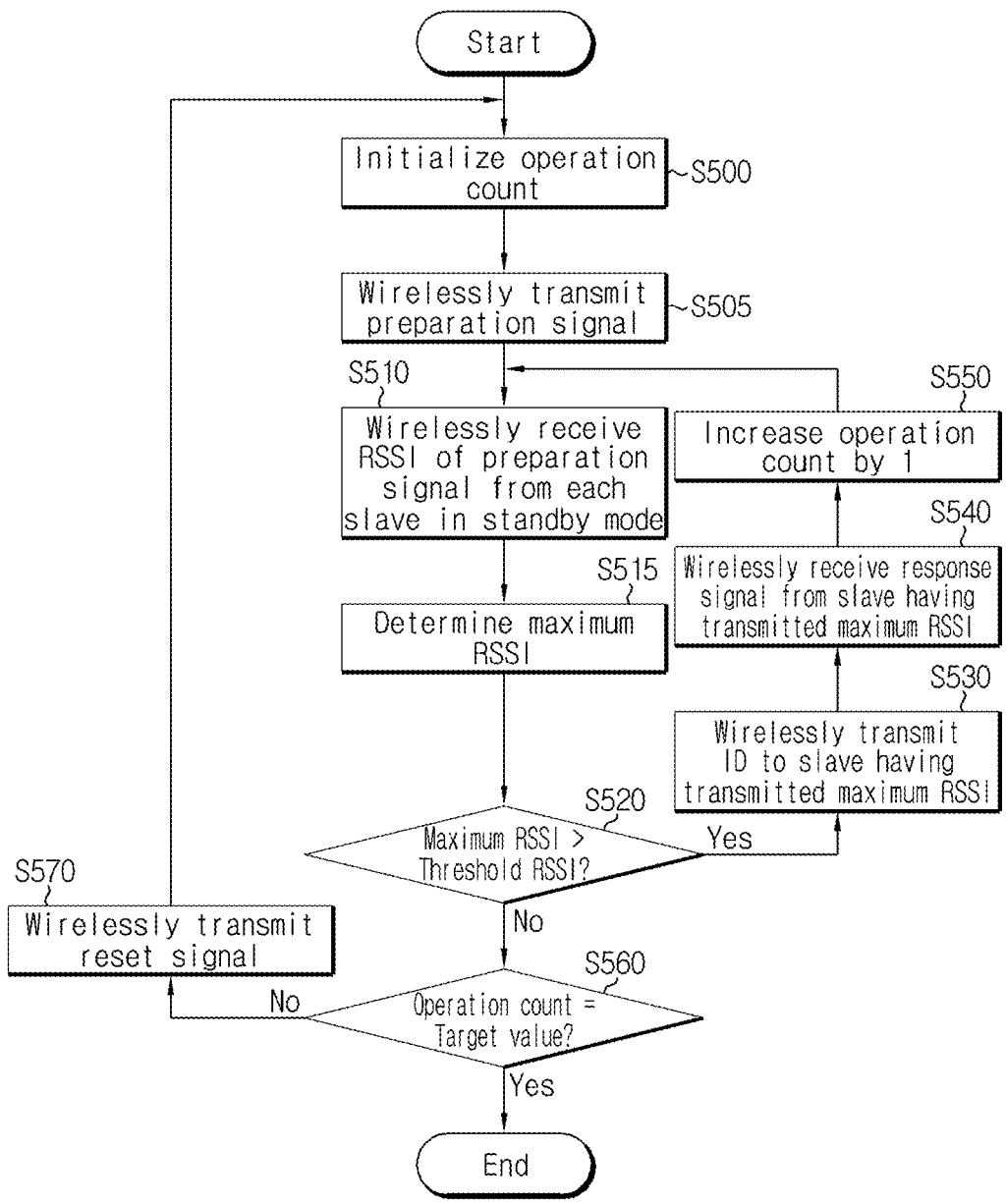
FIG. 5 is a flowchart showing a method for sequentially assigning IDs to a plurality of slave management modules included in a wireless battery control system.

FIG. 5 is a flowchart showing a method for sequentially assigning IDs to the plurality of slave management modules included in the wireless battery control system 30.

Referring to FIGS. 1 to 5, in step S500, the master 100 initializes the operation count. The initialized operation count has a preset value (for example, 1). The value of the operation count is associated with the physical order of a slave (for example, 200_k) to be assigned with an ID among the plurality of slaves 200_1~200_N.

In step S505, the master 100 wirelessly transmits a preparation signal. The preparation signal may be wirelessly transmitted by a broadcast method. The preparation signal wirelessly transmitted in the step S505 may be wirelessly received by each of the slaves 200_1~200_N that is in the standby mode. Each slave in the standby mode wirelessly transmits the RSSI of the preparation signal to the master 100, in response to receiving the preparation signal.

In step S510, the master 100 wirelessly receives the RSSI of the preparation signal from each slave 200 operating in the standby mode. When the value of the operation count is k, (N-k) slaves 200 will operate in the standby mode. The RSSI may be wirelessly transmitted from each slave 200 to the master 100 by a unicast method. Referring to FIGS. 1 to 4, because the slave 200_i is closer to the master antenna MA of the master 100 than the slave 200_i+1, it will be easily understood that the RSSI of the preparation signal received by the slave 200_i will be larger than the RSSI of the preparation signal received by the slave 200_i+1.

In step S515, the master 100 determines a maximum RSSI among the RSSIs wirelessly received from each slave 200 that is in the standby mode. For example, when the value of the operation count is k, the master 100 wirelessly receives a maximum of (N-k) RSSIs. The master 100 may determine a largest value among the (N-k) RSSIs by comparing the RSSIs wirelessly received in the step S510. When all the slaves 200_1~200_N are not operating in the standby mode, none of the plurality of slaves 200_1~200_N wirelessly transmits the RSSI to the master 100. Accordingly, when no RSSI is wirelessly received, the master 100 may determine that the maximum RSSI is 0.

In step S520, the master 100 determines whether the maximum RSSI is larger than the threshold RSSI. When (i) ID assignment to all the plurality of slaves 200_i~200_N is completed or (ii) an error occurred during transmission/reception of the preparation signal or RSSI, the maximum RSSI may be equal to or less than the threshold RSSI. When a value of the step S520 is "YES", step S530 is performed. When the value of the step S520 is "NO", step S560 is performed.

In step S530, the master 100 wirelessly transmits an ID to one slave 200 having wirelessly transmitted the maximum RSSI. Each ID wirelessly transmitted by the master 100 corresponds to the current operation count, and is information indicating a relative positional relationship between the plurality of slaves 200_i~200_N. That is, the ID indicates the order in which each of the plurality of slaves 200_i~200_N is close to or far from the master 200. The master 100 may identify which of the plurality of battery modules 20 each slave 200 manages based on the ID assigned to each slave 200 by the master 100. The slave 200 having wirelessly received the ID from the master 100 may wirelessly transmit the preparation signal, and terminate the standby mode. For example, when the slave 200_*i* wirelessly receives the ID, the slave 200_*i* stores the ID in the memory device therein, and wirelessly transmits a response signal to the master 100. Subsequently, the slave 200_*i* may wirelessly transmit the preparation signal to the slaves 200_*i*+1~200_N by a broadcast method, and terminate the standby mode. The preparation signal wirelessly transmitted by the slave 200_*i* may be received by the remaining slaves still operating in the standby mode. Accordingly, after the master 100 enters the ID assignment mode and the ID is initially assigned to one (for example, 200_1) of the plurality of slaves 200_1~200_N, the preparation signal is wirelessly transmitted by the slave 200 to which the ID is most recently assigned, rather than the master 100.

In step S540, the master 100 wirelessly receives the response signal from one slave 200 having wirelessly transmitted the maximum RSSI. The wireless reception of the response signal by the master 100 indicates that the ID for one slave having wirelessly transmitted the maximum RSSI is assigned normally.

When IDs are sequentially assigned from the slave 200_1 to the slave 200_*i*, each of the remaining slaves 200_*i*+1~200_N may wirelessly transmit the RSSI of the preparation signal wirelessly received from the slave 200_*i* to the master 100.

In step S550, the master 100 increases the operation count by 1, in response to receiving the response signal. After the step S550 is performed, the method may return to the step S510. Because the operation count increases by 1 each time an ID is assigned to each slave 200, different IDs may be assigned to the plurality of slaves 200_1~200_N.

In step S560, the master 100 determines whether the operation count is equal to a target value. The target value corresponds to the total number N of the slaves 200_1~200_N included in the wireless battery control system 30. When IDs are assigned to all the plurality of slaves 200_1~200_N, the operation count is equal to the target value. On the contrary, when an ID is not yet assigned to at least one slave, the operation count is smaller than the target value. "NO" as both a value of the step S520 and a value of the step S560 indicates that an error occurred during transmission/reception of the preparation signal or RSSI. When the value of the step S560 is "YES", the ID assignment mode of the master 100 ends. When the value of the step S560 is "NO", step S570 is performed.

In step S570, the master 100 wirelessly transmits a reset signal to the plurality of slaves 200_1~200_N. The reset signal may be wirelessly transmitted to all the plurality of slaves 200_1~200_N by a broadcast method. In response to the reset signal, each slave 200 may invalidate the ID already assigned to itself, and enter the standby mode. When the method returns to the step S500 after the step S570, ID assignment to the plurality of slaves 200_1~200_N may re-start.

Figure 6:
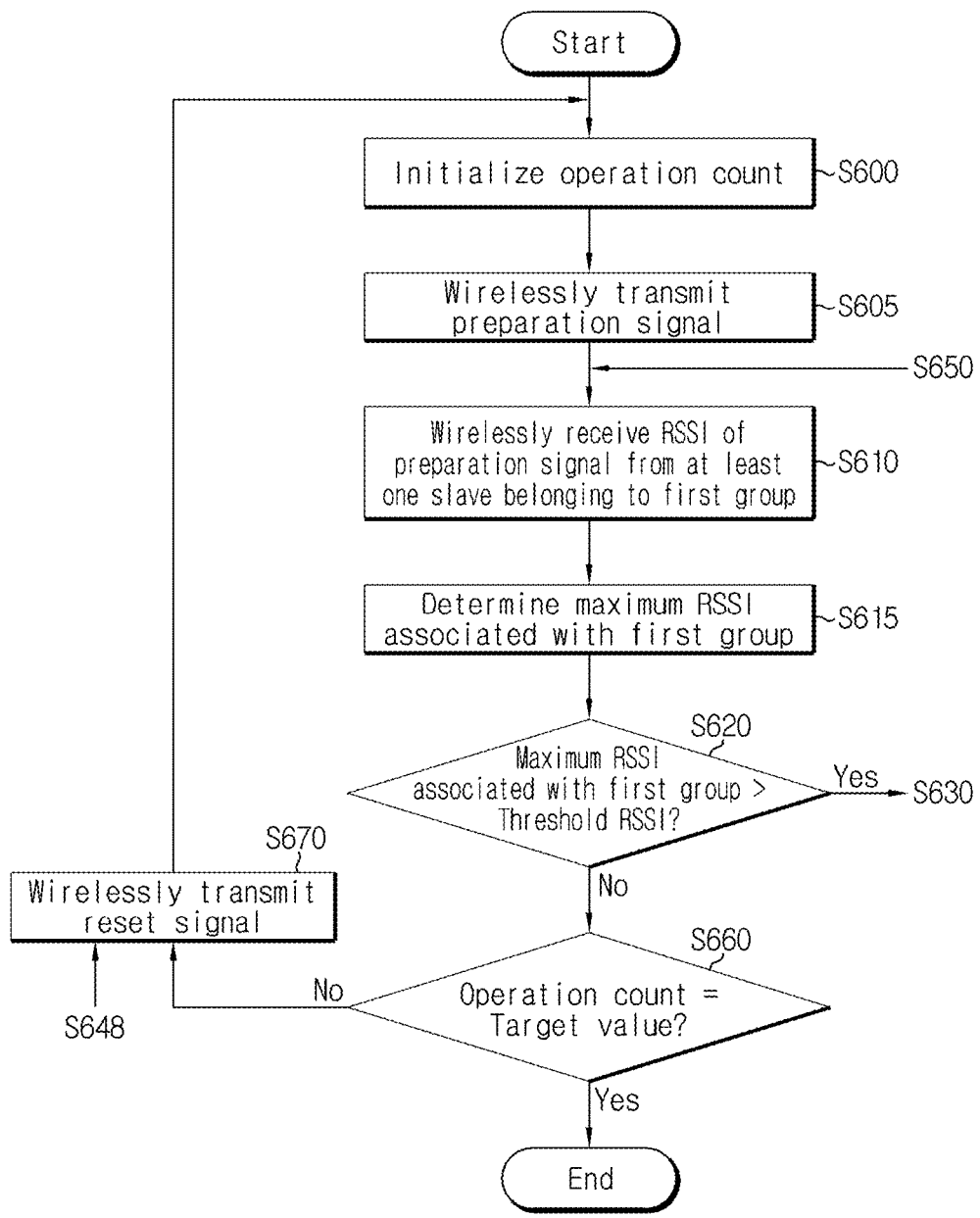
FIGS. 6 and 7 are flowcharts showing another method for sequentially assigning IDs to a plurality of slave management modules included in a wireless battery control system.
Figure 7:
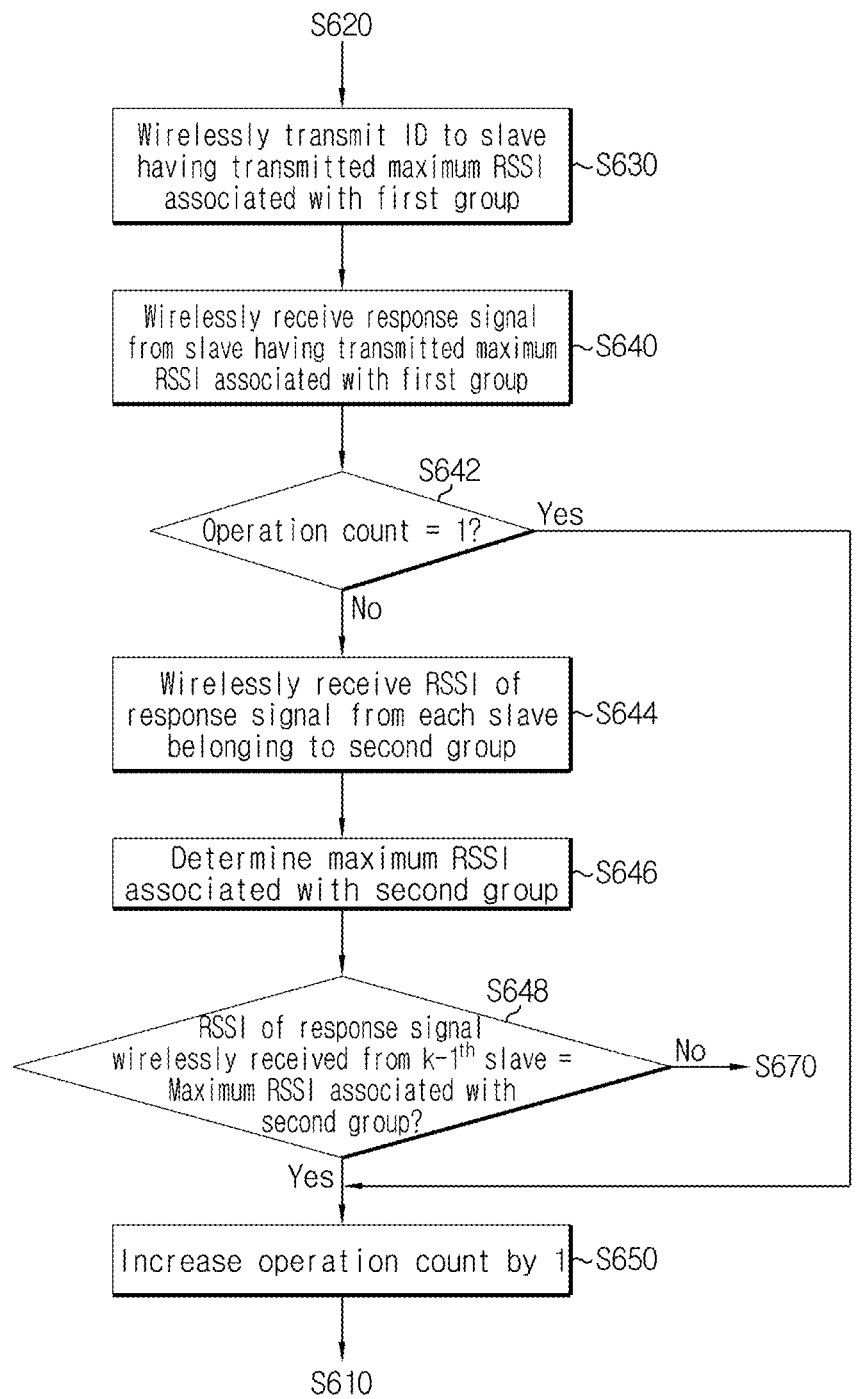

FIGS. 6 and 7 are flowcharts showing another method for sequentially assigning IDs to the plurality of slave management modules included in the wireless battery control system 30.

Referring to FIGS. 3, 4, 6 and 7, in step S600, the master 100 initializes the operation count. The initialized operation count may be equal to a predetermined natural number (for example, 1).

In step S605, the master 100 wirelessly transmits a preparation signal. The preparation signal may be wirelessly transmitted by a broadcast method. The preparation signal wirelessly transmitted in the step S605 may be wirelessly received by the first slave antenna SA1 or the second slave antenna SA2 of at least one of the plurality of slaves 200_1~200_N that is in the standby mode. At least one of the plurality of slaves 200_1~200_N wirelessly transmits the RSSI of the preparation signal to the master 100 through the first slave antenna SA1 in response to receipt of the preparation signal in the standby mode.

In step S610, the master 100 wirelessly receives the RSSI of the preparation signal from at least one of the slaves 200_*k*~200_N belonging to a first group. The master 100 may wirelessly receive a maximum of (N−k+1) RSSIs in the step S610. The sign 'k' used to describe the method of FIG. 6 indicates the operation count. The first group includes the slaves 200_*k*~200_N not yet assigned with IDs among the plurality of slaves 200_1~200_N. For example, when the operation count is 1, all the plurality of slaves 200_1~200_N may belong to the first group. In another example, when the operation count is 3, only the slaves 200_3~200_N among the plurality of slaves 200_1~200_N may belong to the first group.

In step S615, the master 100 determines a maximum RSSI associated with the first group. In detail, the master 100 determines the maximum RSSI among the RSSIs of the preparation signal from at least one of the slaves 200_*k*~200_N belonging to the first group. When at least two RSSIs are received by the master 100 in the step S610, a largest one of the at least two RSSIs may be determined as the maximum RSSI associated with the first group. When only one RSSI is received by the master 100 in the step S610, the received RSSI may be determined as the maximum RSSI associated with the first group. When there is no RSSI of the preparation signal received by the master 100 in the step S610, the maximum RSSI associated with the first group may be determined as 0.

Referring to FIG. 3, when x=1~N−1, y=2~N, x<y, because the slave 200_*x* is closer to the master antenna MA of the master 100 than the slave 200_*y*, the RSSI of the preparation signal received by the slave 200_*x* being larger than the RSSI of the preparation signal received by the slave 200_*y* is normal. However, an abnormal situation in which the RSSI of the preparation signal received by the slave 200_*x* is equal to or smaller than the RSSI of the preparation signal received by the slave 200_*y* may occur due to noise from the outside or the like. Accordingly, it is necessary to verify whether the maximum RSSI associated with the first group determined in the step S615 is equal to the RSSI detected by the slave 200_*k* closest to the master 100 among the slaves 200_*k*~200_N belonging to the first group.

In step S620, the master 100 determines whether the maximum RSSI associated with the first group is larger than a threshold RSSI. When (i) ID assignment to all the plurality of slaves 200_1~200_N is completed or (ii) any problem (for example, signal interference) occurs in the transmission/reception of the preparation signal or RSSI or the like, the maximum RSSI associated with the first group may be equal to or less than the threshold RSSI. When a value of the step S620 is "YES", step S630 is performed. When the value of the step S620 is "NO", step S660 is performed.

In step S630, the master 100 wirelessly transmits an ID to the slave 200_*m* having wirelessly transmitted the maximum RSSI associated with the first group. The ID wirelessly transmitted in the step S630 is associated with the operation count k, and may be referred to as 'k$^{th}$ ID'. The slave 200_*m* must be one of the slaves 200_*k*~200_N belonging to the first group. The slave 200_*m* may store the ID wirelessly transmitted by the master 100 in the step S630 in the memory device therein, and wirelessly transmit a response signal by a broadcast method. Subsequently, the slave 200_m may wirelessly transmit the preparation signal by a broadcast method in place of the master 100, and terminate the standby mode. Since the slave 200_k is closest to the master 100 among the slaves 200_k~200_N of the first group, it can be said that the ID is assigned properly only when the slave 200_m is the slave 200_k. Whether the slave 200_m is the slave 200_k is verified through steps S642, S644, S646 and S648 as described below.

The response signal wirelessly transmitted by the slave 200_m may be received by the master 100 and the slaves 200_1~200_k−1 belonging to a second group. Each of the slaves 200_1~200_k−1 belonging to the second group may wirelessly receive the response signal from the slave 200_m through the second slave antenna SA2 thereof, detect the RSSI of the received response signal, and wirelessly transmit the detected RSSI of the received response signal to the master 100 through the first slave antenna SA1 thereof. The slaves 200_1~200_k−1 of the second group are positioned upstream of the $k^{th}$ slave 200_k.

The preparation signal wirelessly transmitted by the slave 200_m may be received by the slaves 200_k+1~200_N belonging to the first group. Accordingly, after the ID for the slave 200_1 is assigned by the master 100, the slave 200_m assigned with an ID most lately wirelessly transmits the preparation signal in place of the master 100. Accordingly, at least one of the slaves 200_k+1~200_N of the first group may wirelessly transmit the RSSI of the preparation signal wirelessly transmitted by the slave 200_m to the master 100.

In step S640, the master 100 wirelessly receives the response signal from the slave 200_m having wirelessly transmitted the maximum RSSI associated with the first group.

In step S642, the master 100 determines whether the operation count is equal to 1. When a value of the step S642 is "NO", step S644 is performed. When the value of the step S642 is "YES", step S650 is performed.

In step S644, the master 100 wirelessly receives the RSSI of the response signal from each of the slaves 200_1~200_k−1 belonging to the second group.

In step S646, the master 100 determines a maximum RSSI associated with the second group. In detail, the master 100 determines the largest one of the RSSIs of the response signal wirelessly received from each of the slaves 200_1~200_k−1 belonging to the second group as the maximum RSSI associated with the second group.

In step S648, the master 100 determines whether the RSSI of the response signal wirelessly received from the $k-1^{th}$ slave 200_k−1 is equal to the maximum RSSI associated with the second group. When a value of the step S648 is "YES", step S650 is performed. When the value of the step S648 is "NO", step S670 may be performed.

In step S650, the master 100 increases the operation count k by 1. After the step S650 is performed, the method may return to the step S610. Since the operation count increases by 1 each time an ID is assigned to the plurality of slaves 200_1~200_N sequentially, different IDs may be assigned to the plurality of slaves 200_1~200_N.

In step S660, the master 100 determines whether the operation count is equal to a target value. The target value may be a natural number that is larger by 1 than the total number N of the slaves 200_1~200_N included in the wireless battery control system 30. When IDs are assigned to all the plurality of slaves 200_1~200_N, the operation count is equal to the target value. On the contrary, when an ID is not yet assigned to at least one slave (for example, 200_N), the operation count is smaller than the target value. "NO" as both a value of the step S620 and a value of the step S660 indicates that an error occurred during assignment of the $k^{th}$ ID to the slave 200_k. When the value of the step S660 is "NO", step S670 is performed. When the value of the step S660 is "YES", the method ends.

In step S670, the master 100 wirelessly transmits a reset signal. The reset signal may be wirelessly transmitted to the plurality of slaves 200_1~200_N by a broadcast method. In response to the reset signal, each of the plurality of slaves 200_1~200_N may invalidate the ID already assigned to itself, and enter the standby mode. When the method returns to the step S600 after the step S670, ID assignment to the plurality of slaves 200_1~200_N may re-start.

Each time the master 100 wirelessly transmits the reset signal, the master 100 may increase a reset count by 1 together. When the reset count reaches a predetermined fault value, the master 100 may transmit an error message to an external device, or stop charging/discharging the plurality of battery modules 20_1~20_N. The error message indicates that it is impossible to assign IDs to the plurality of slaves 200_1~200_N sequentially.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

DESCRIPTION OF REFERENCE NUMERALS

10: Battery pack
20: Battery module
30: Wireless battery control system
100: Master management module
200: Slave management module

What is claimed is:
1. A wireless battery control system for a battery pack including first to $N^{th}$ battery modules, the wireless battery control system comprising:
a master management module; and
first to $N^{th}$ slave management modules configured to respectively monitor a state of each of the first to $N^{th}$ battery modules,
wherein the first to $N^{th}$ slave management modules are sequentially positioned so that distances from the master management module are different from each other,
wherein, when the master management module enters an ID assignment mode, the master management module is configured to:
initialize an operation count, and wirelessly transmit a preparation signal, wherein, in response to receiving the preparation signal from the master management module or another slave management module, each slave management module is further configured, only while operating in a standby mode, to measure a Received Signal Strength Indicator (RSSI) of the received preparation signal and to wirelessly transmit the measured RSSI of the received preparation signal to the master management module, wherein the master management module is further configured to wirelessly transmit an ID associated with the operation count to a slave management module having wirelessly transmitted a maximum RSSI among at least one RSSI of the received preparation signal measured and transmitted respectively only by at least one slave management module in the standby mode among the first to $N^{th}$ slave management modules, wherein the slave management module having wirelessly transmitted the maximum RSSI among the at least one slave management module in the standby mode is further configured to wirelessly transmit the received preparation signal and to terminate operating in the standby mode, in response to receiving the ID wirelessly transmitted thereto from the master management module, wherein the master management module is further configured to increase the operation count by 1 after the master management module wirelessly transmits the ID to the slave management module having wirelessly transmitted the maximum RSSI among the at least one slave management module in the standby mode, and wherein N is a natural number of 2 or greater.

2. The wireless battery control system according to claim 1, wherein:

each slave management module includes:
a first slave antenna; and
a second slave antenna; and
the first slave antenna is positioned closer to the master management module than the second slave antenna.

3. The wireless battery control system according to claim 2, wherein each slave management module is further configured to:

wirelessly receive the preparation signal from the master management module or another slave management module through the first slave antenna;

wirelessly receive the ID through the first slave antenna while operating in the standby mode;

wirelessly transmit the RSSI of the received preparation signal through the first slave antenna only while operating in the standby mode; and wirelessly transmit the preparation signal through the second slave antenna.

4. The wireless battery control system according to claim 2, wherein the first slave antenna, of one of two slave management modules positioned adjacent to each other, and the second slave antenna, of the other slave management module, are positioned within a predetermined distance.

5. The wireless battery control system according to claim 2, wherein the first slave antenna, of one of the first to $N^{th}$ slave management modules positioned closest to the master management module, is positioned within a predetermined distance from a master antenna of the master management module.

6. The wireless battery control system according to claim 1, wherein the master management module is further configured to:

determine whether the operation count is equal to a target value, if the maximum RSSI is equal to or less than a threshold RSSI; and terminate the ID assignment mode, if the operation count is equal to the target value.

7. The wireless battery control system according to claim 1, wherein:

the master management module is further configured to:
determine whether the operation count is equal to a target value, if the maximum RSSI is equal to or less than a threshold RSSI; and
wirelessly transmit a reset signal, if the operation count is unequal to the target value; and
each slave management module is further configured to invalidate the ID already assigned thereto by the master management module, in response to the reset signal.

8. The wireless battery control system according to claim 1, wherein:

each slave management module is further configured to:
wirelessly transmit a response signal in response to receiving the ID wirelessly transmitted thereto from the master management module; and
only while operating in the standby mode, measure a RSSI of a response signal wirelessly received from another slave management module and wirelessly transmit the RSSI of the received response signal to the master management module;

the master management module is further configured to:
wirelessly receive, from each of the first to $(k-1)^{th}$ slave management modules, the RSSI of the received response signal when the response signal is wirelessly transmitted by a slave management module assigned with the ID in the $k^{th}$ order among the first to $N^{th}$ slave management modules; and
increase the operation count by 1, if a largest one of the RSSIs of the received response signal wirelessly received respectively from the first to $(k-1)^{th}$ slave management modules is equal to the RSSI of the received response signal wirelessly received from the $(k-1)^{th}$ slave management module; and k is a natural number greater than or equal to 2, and less than or equal to N.

9. The wireless battery control system according to claim 8, wherein:

the master management module is further configured to wirelessly transmit a reset signal if the largest one of the RSSIs of the received response signal received from each of the first to $(k-1)^{th}$ slave management modules is unequal to the RSSI of the received response signal received from the $(k-1)^{th}$ slave management module; and each slave management module is configured to invalidate the ID already assigned thereto by the master management module, in response to the reset signal.

10. A battery pack comprising the wireless battery control system according to claim 1.

11. The wireless battery control system of claim 1, wherein each slave management module in the standby mode is further configured to wirelessly transmit the measured RSSI of the received preparation signal to the master management module regardless of whether the preparation signal is received from the master management module or another slave management module.

12. The wireless battery control system of claim 1, wherein each slave management module in the standby mode is further configured to wirelessly transmit the measured RSSI of the preparation signal received from another slave management module to the master management module.

13. The wireless battery control system of claim 1, wherein the master management module is configured to receive the RSSI of the received preparation signal measured and transmitted only by each of the at least one slave management module in the standby mode among the first to $N^{th}$ slave management modules.

14. A method for assigning IDs to first to $N^{th}$ slave management modules sequentially positioned so that distances from a master management module are different from each other, the method comprising:
    initializing, by the master management module, an operation count, and wirelessly transmitting a preparation signal, when the master management module enters an ID assignment mode;
    wirelessly receiving, by the master management module only from each respective slave management module operating in a standby mode, a Received Signal Strength Indicator (RSSI) of the preparation signal measured by the respective slave management module in the standby mode, the preparation signal having been received by the respective slave management module in the standby mode from the master management module or another slave management module;
    wirelessly transmitting, by the master management module, an ID associated with the operation count to a slave management module having wirelessly transmitted a maximum RSSI among at least one RSSI of the preparation signal measured and transmitted respectively only by at least one slave management module in the standby mode among the first to $N^{th}$ slave management modules, if the maximum RSSI is larger than a threshold RSSI; and
    increasing, by the master management module, the operation count by 1 after the master management module wirelessly transmits the ID to the slave management module having wirelessly transmitted the maximum RSSI among the at least one slave management module in the standby mode,
    wherein N is a natural number of 2 or greater.

15. The method according to claim 14, further comprising:
    determining, by the master management module, whether the operation count is equal to a target value, if the maximum RSSI is equal to or less than the threshold RSSI; and
    ending the ID assignment mode if the operation count is equal to the target value.

16. The method according to claim 14, further comprising:
    determining, by the master management module, whether the operation count is equal to a target value, if the maximum RSSI is equal to or less than the threshold RSSI; and
    wirelessly transmitting, by the master management module, a reset signal, if the operation count is unequal to the target value,
    wherein each slave management module invalidates the ID assigned thereto by the master management module, in response to the reset signal.

17. The method according to claim 14, further comprising:
    wirelessly receiving, by the master management module respectively from the first to $(k-1)^{th}$ slave management modules, RSSIs of a response signal respectively measured by the first to $(k-1)^{th}$ slave management modules when the response signal is wirelessly transmitted by a slave management module assigned with the ID in the $k^{th}$ order among the first to $N^{th}$ slave management modules and is received by the first to $(k-1)^{th}$ slave management modules; and
    increasing, by the master management module, the operation count by 1, when a largest one of the RSSIs of the response signal wirelessly received respectively from the first to $(k-1)^{th}$ slave management modules is equal to the RSSI of the response signal wirelessly received from the $(k-1)^{th}$ slave management module,
    wherein k is a natural number of 2 or greater and N or less.

18. The method according to claim 17, further comprising:
    wirelessly transmitting, by the master management module, a reset signal if the largest one of the RSSIs of the response signal wirelessly received respectively from the first to $(k-1)^{th}$ slave management modules is unequal to the RSSI of the response signal wirelessly received from the $(k-1)^{th}$ slave management module,
    wherein each slave management module invalidates the ID already assigned thereto by the master management module, in response to the reset signal.

19. The method of claim 14, wherein the wirelessly receiving of the RSSI by the master management module includes:
    wirelessly receiving, by the master management module only from each respective slave management module operating in the standby mode, the RSSI of the preparation signal measured by the respective slave management module in the standby mode, regardless of whether the preparation signal is received by the respective slave management module in the standby mode from the master management module or from another slave management module.

20. The method of claim 14, wherein the wirelessly receiving of the RSSI by the master management module includes:
    wirelessly receiving, by the master management module only from each respective slave management module operating in the standby mode, the RSSI of the preparation signal measured by the respective slave management module in the standby mode, the preparation signal having been received by the respective slave management module in the standby mode from another slave management module.

* * * * *